(12) United States Patent
Pryputniewicz et al.

(10) Patent No.: US 7,981,698 B2
(45) Date of Patent: Jul. 19, 2011

(54) REMOVAL OF INTEGRATED CIRCUITS FROM PACKAGES

(75) Inventors: Dariusz R. Pryputniewicz, Stoneham, MA (US); Thomas F. Marinis, Haverhill, MA (US); Gary B. Tepolt, Pelham, NH (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 684 days.

(21) Appl. No.: 11/716,221

(22) Filed: Mar. 9, 2007

(65) Prior Publication Data

US 2008/0217773 A1     Sep. 11, 2008

(51) Int. Cl.
*H01L 21/00* (2006.01)
*H01L 23/48* (2006.01)
*G01R 31/26* (2006.01)

(52) U.S. Cl. .......... 438/4; 438/14; 438/15; 438/16; 438/17; 438/18; 257/734; 257/735; 257/736; 257/737; 257/738

(58) Field of Classification Search ...... 438/4, 106–127, 438/435.4–455.4; 257/734–738
See application file for complete search history.

(56) References Cited

U.S. PATENT DOCUMENTS

| | | |
|---|---|---|
| 3,969,813 A | 7/1976 | Minetti et al. |
| 4,043,080 A | 8/1977 | Maxwell |
| 4,063,542 A | 12/1977 | Uemura |
| 4,089,704 A | 5/1978 | Heiss, Jr. et al. |
| 4,213,698 A | 7/1980 | Firtion et al. |
| 4,344,809 A | 8/1982 | Wensink |
| 4,359,360 A | 11/1982 | Harris et al. |
| 4,384,917 A | 5/1983 | Wensink |
| 4,822,441 A | 4/1989 | Ohta et al. |
| 4,826,556 A | 5/1989 | Kobayashi |
| 4,992,135 A | 2/1991 | Doan |
| 5,193,314 A | 3/1993 | Wormley et al. |
| 5,223,083 A | 6/1993 | Cathey et al. |
| 5,252,179 A | 10/1993 | Ellerson et al. |
| 5,271,798 A | 12/1993 | Sandhu et al. |
| 5,291,693 A | 3/1994 | Nguyen |
| 5,424,254 A * | 6/1995 | Damiot ............... 438/106 |
| 5,443,675 A | 8/1995 | Wensink |
| 5,479,108 A | 12/1995 | Cheng |
| 5,585,675 A | 12/1996 | Knopf |
| 5,611,876 A | 3/1997 | Newton et al. |
| 5,703,493 A | 12/1997 | Weeks et al. |
| 5,750,423 A | 5/1998 | Ishii |
| 5,766,496 A | 6/1998 | Martin |
| 5,783,098 A | 7/1998 | Martin et al. |
| 5,792,305 A | 8/1998 | Winsemius et al. |
| 5,855,727 A | 1/1999 | Martin et al. |
| 5,915,370 A | 6/1999 | Casper |
| 5,932,061 A | 8/1999 | Lam |
| 5,964,646 A | 10/1999 | Kassir et al. |
| 6,033,933 A | 3/2000 | Hur |
| 6,055,976 A | 5/2000 | Davies et al. |
| 6,301,121 B1 * | 10/2001 | Lin .................. 361/783 |
| 6,358,852 B1 * | 3/2002 | Li et al. ............ 438/690 |
| 6,368,886 B1 * | 4/2002 | Van Broekhoven et al. ..... 438/15 |
| 6,677,169 B1 * | 1/2004 | Li .................. 438/15 |
| 6,678,167 B1 * | 1/2004 | Degani et al. ........ 361/760 |
| 2006/0046350 A1 * | 3/2006 | Jiang et al. ........ 438/114 |

* cited by examiner

*Primary Examiner* — Michael S Lebentritt
*Assistant Examiner* — Karen M Kusumakar
(74) *Attorney, Agent, or Firm* — Goodwin Procter LLP

(57) ABSTRACT

Packaging is substantially entirely removed from an integrated circuit die. The method allows the batch processing of several integrated circuit dies, such that packaging is removed from each die approximately simultaneously.

15 Claims, 5 Drawing Sheets

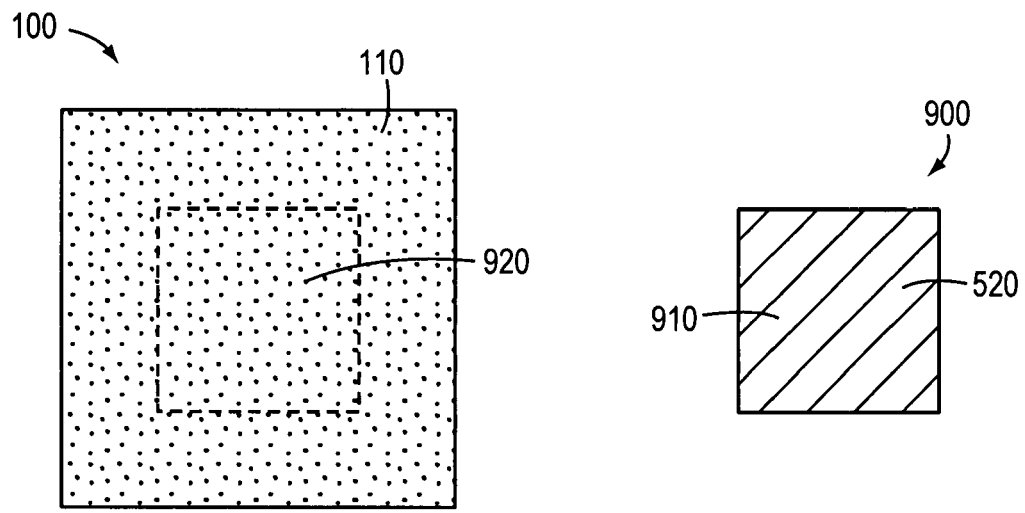
FIG. 9A
FIG. 9B
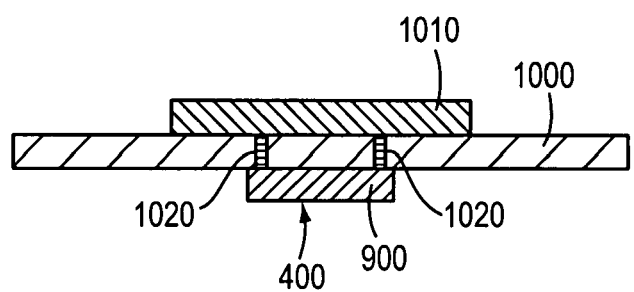
FIG. 10

REMOVAL OF INTEGRATED CIRCUITS FROM PACKAGES

FIELD OF THE INVENTION

This invention relates generally to removal of packaging, and in particular to removing packaging for integrated circuits.

BACKGROUND

Integrated circuit dies, or chips, are fabricated by the tens or hundreds on large semiconductor substrates. Once diced into discrete chips, they are encapsulated in individual packages that provide mechanical stability and protection from moisture and contamination. Conventional integrated circuit packages are made of ceramic materials such as alumina or plastic materials such as epoxy or silicone.

One method to increase the functionality and decrease the cost of integrated electronic devices is the integration of multiple integrated circuit dies in a common package. However, many suitable integrated circuit dies are only available pre-packaged in individual packages, and not directly from a diced or undiced wafer. In order to combine such components in a common package of minimum size, it is necessary to first remove the die from each pre-packaged component. Thus recovered, the bare dies may be combined together to provide enhanced functionality in a reduced volume.

Unfortunately, conventional methods of removing packaging from integrated circuit dies suffer from several problems. Conventional processes are often customized for each particular die, limiting throughput to one die at a time. Such processes include steps calibrated manually that are extremely time-consuming. Moreover, conventional processes often leave portions of wiring and/or ball bonds attached to the top surface of the die. Hence, to achieve a planar surface with such protrusions intact, a portion of the original package is necessarily preserved over the top surface of the die. Moreover, in order that the die not be damaged by mechanical package removal processes, a border of the package is also often left around the perimeter of the die, increasing its final cross-sectional area. These remaining portions of the package not only obscure the top surface of the die, preventing visual inspection, but can also flake off during subsequent processing and contaminate equipment.

SUMMARY

The foregoing limitations of conventional packaging removal schemes are herein addressed by removal of entire encapsulating packages without damage to the integrated circuit die within. Moreover, the top surface of the die may be left suitably planar for bonding to other electronic devices or higher level system packaging. Finally, the removal methods described herein are amenable to batch processing of multiple packaged integrated circuit dies at the same time, and can be implemented using readily available equipment.

In accordance with the invention, the encapsulating package surrounding an integrated circuit die is substantially or completely removed. Advantages of this approach include minimization of the cross-sectional area of the integrated circuit die after package removal, as well as exposure of the entire body of the integrated circuit die, specifically the top surface, such that it can be visually inspected.

In some embodiments, in order to achieve an exposed top surface of the integrated circuit die that is both substantially planar and undamaged by the package removal process, the wires and/or ball bonds electrically connecting the integrated circuit die to the leads of the package are substantially removed while using a portion of the package to mask (and hence protect) the top surface of the integrated circuit die. With substantial planarity of the top surface thus achieved, the entirety of the remaining package may be completely removed, releasing the integrated circuit die.

In one aspect, embodiments of the invention feature a method including providing a structure including a package with a plurality of leads, an integrated circuit die having a first cross-sectional area within the package, and a plurality of wires and ball bonds within the package. A first portion of the package disposed over a top surface of the integrated circuit die and at least a portion of each of the plurality of wires are removed. A remaining portion of each of the plurality of wires and at least a portion of each ball bond are also removed; a second portion of the package disposed over the top surface of the integrated circuit die protects the top surface during removal. Finally, the second portion of the package is removed. Removing the second portion of the package may expose the top surface of the integrated circuit die, and the exposed top surface may be substantially planar. In an embodiment, the integrated circuit die is bonded to an electronic device, and at least one electrical connection is be formed between the integrated circuit die and the electronic device. The integrated circuit die may be thinned after the second portion is removed.

One or more of the following elements may be included. Removing the second portion of the package may include removing substantially all of the remaining package. A final cross-sectional area of the integrated circuit die after removal of the second portion may be substantially equal to the first cross-sectional area. A third portion of the package disposed under a bottom surface of the integrated circuit die may be removed prior to removing the first portion of the package. A heat sink disposed under the bottom surface of the integrated circuit die may be removed. Any remaining portion of each ball bond may be removed. After removing the second portion of the package, the integrated circuit die may have a second set of electrical characteristics substantially equivalent to a first set of electrical characteristics the integrated circuit die had prior to removing the first portion of the package.

In another aspect, embodiments of the invention feature a method including providing a plurality of integrated circuit dies. Each integrated circuit die is disposed within one of a plurality of packages, and at least a first portion of each of the packages is removed approximately simultaneously; removal of the first portion of each of the plurality of packages exposes a plurality of ball bonds disposed over a top surface of each of the plurality of integrated circuit dies. At least a portion of each of the plurality of ball bonds may be removed approximately simultaneously, wherein a second portion of each of the plurality of packages protects the top surface of each of the plurality of integrated circuit dies during removal. The second portion of each of the plurality of packages may be removed approximately simultaneously, and such removal may expose the top surface of each of the plurality of integrated circuit dies. Removing the second portion of each of the plurality of packages may include removing substantially all of a remaining portion of each of the plurality of packages, and the top surface of each of the plurality of integrated circuit dies may be substantially planar.

In yet another aspect, embodiments of the invention feature a structure including an integrated circuit die and a plurality of bond pads disposed over a top surface of the integrated circuit die, wherein only a ball bond portion is disposed over each of the plurality of bond pads. Each ball bond portion may be less than 75% of an intact ball bond, and may include gold.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 9 is a plan view comparison of an integrated circuit die before and after its package is removed; and FIG. 10 is a cross-sectional view of an integrated circuit die bonded to an electronic device after package removal.

DETAILED DESCRIPTION

Figure 1:
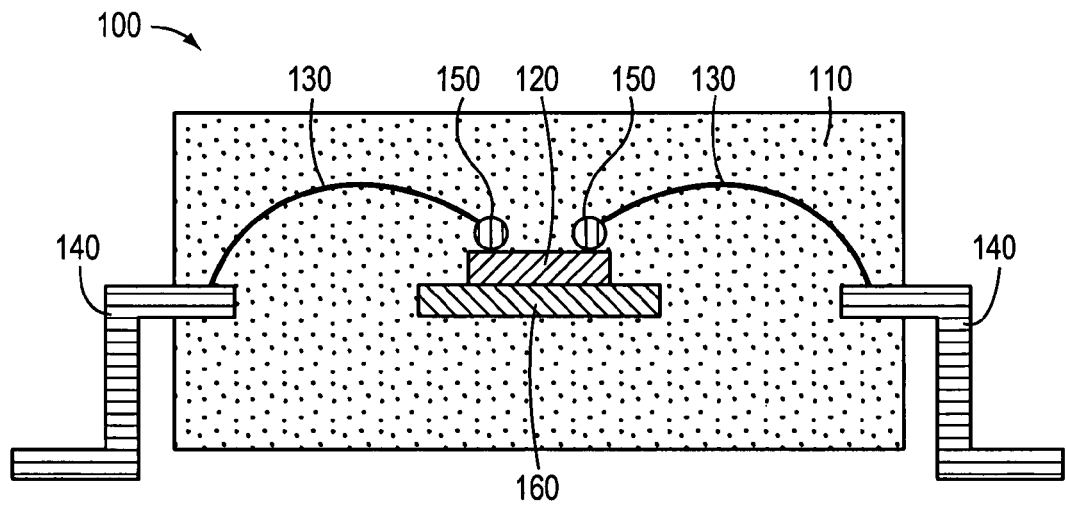
FIGS. 1-7 are schematic cross-sectional views of a packaged integrated circuit die in accordance with the invention.

Referring to FIG. 1, a packaged integrated circuit die may be prepared for package removal. The packaged integrated circuit die 100 includes a package 110, which includes, or consists essentially of, an encapsulating dielectric material such as a ceramic or a plastic (e.g., an epoxy or a silicone). Package 110 surrounds and encapsulates an integrated circuit die 120. Integrated circuit die 120 is a fully processed microelectronic device, e.g., a microprocessor, microcontroller, programmable logic device, or digital signal processor. A series of wires 130 electrically connect integrated circuit die 120 to corresponding leads 140 such that when packaged integrated circuit die 100 is mounted to, e.g., a printed circuit board, electrical signals may be sent to and from integrated circuit die 120. Wires 130 include, or consist essentially of, an electrically conductive material such as a metal or metal alloy. For example, wires 130 may be formed of gold or copper. Leads 140 also include, or consist essentially of, an electrically conductive material such as a metal or metal alloy, e.g., aluminum or Kovar. Wires 130 connect to bonding pads (not shown) on the top surface of integrated circuit die 120 by the formation of ball bonds, as indicated at 150. Ball bonds 150 include, or consist essentially of, the same electrically conductive material as wires 130. Ball bonds 150 may be approximately spherical or cylindrical in shape, and may extend above the top surface of integrated circuit die 120 by approximately 30 to approximately 40 micrometers. Within package 110, integrated circuit die 120 may be attached to a heat sink 160 (i.e., the die pan). Heat sink 160 includes, or consists essentially of, a thermally conductive material. In an embodiment, heat sink 160 consists essentially of a metal such as copper, and is adhered to integrated circuit die 120 by means of a thermally conductive epoxy or adhesive such that a thermal path is maintained between integrated circuit die 120 and heat sink 160. Packaged integrated circuit die 100 also has a desired set of electrical characteristics appropriate for a particular application. These characteristics may be determined by electrical probing of leads 140.

Figure 2:
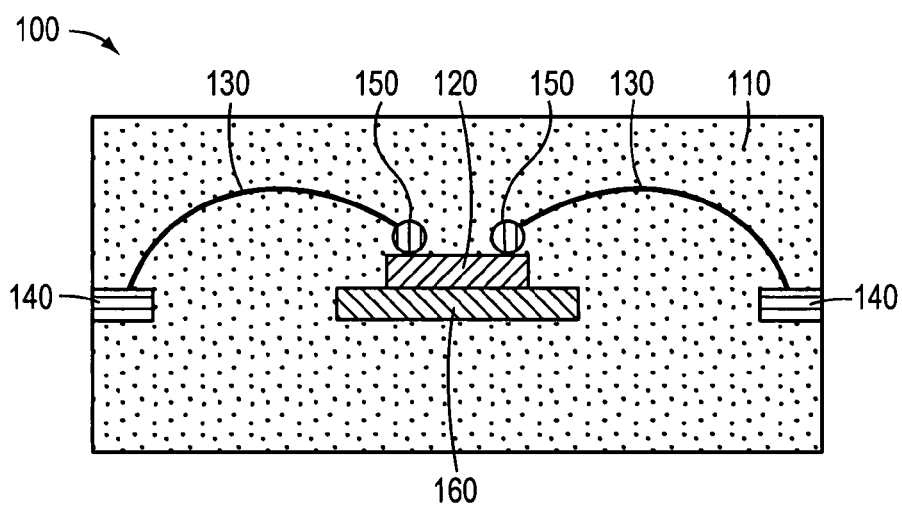
Figure 3:
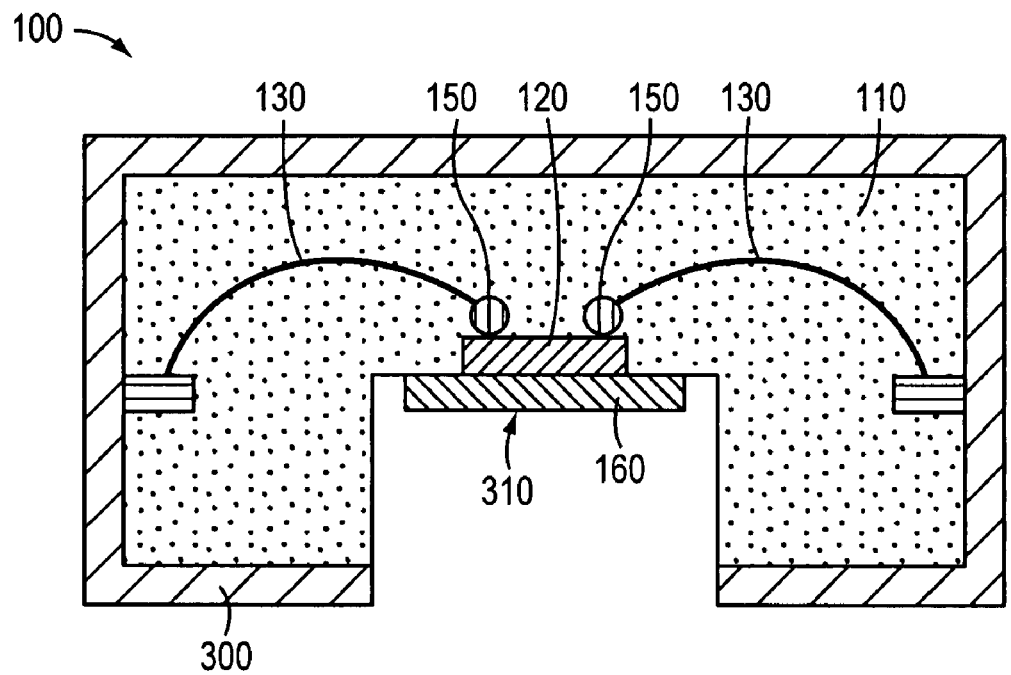
Figure 4:
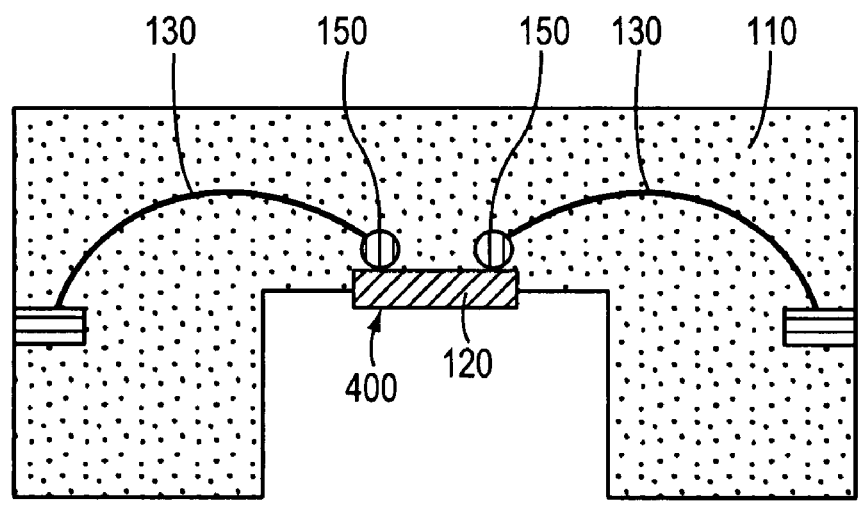

Referring to FIGS. 2-4, the initial stages of package removal are performed on packaged integrated circuit die 100. The portions of leads 140 extending external to package 110 are removed. Packaged integrated circuit die 100 is then surrounded with a masking material 300 such that only an area slightly larger than and substantially aligned with the bottom surfaces of integrated circuit die 120 and heat sink 160 is exposed. Masking material 300 includes, or consists essentially of, a material impervious to the etchant that will be utilized to remove the exposed area of package 110. For example, masking material 300 may be a natural or synthetic rubber. The exposed portion of package 110 is then removed, e.g., by etching in a commercial etch tool such as the D Cap-Delta Dual Acid Decapsulator, available from B&G International, of Santa Cruz, Calif., using a combination of nitric acid ($HNO_3$) and sulfuric acid ($H_2SO_4$).

After the portion of package 110 is removed, a bottom surface 310 of heat sink 160 is exposed. Masking material 300 is then removed from around packaged integrated circuit die 100. Heat sink 160 is removed, e.g., by etching in a commercial etch tool, using a suitable etchant such as a mixture of ferric chloride ($FeCl_3$) and water ($H_2O$). This removal step does not attack remaining portions of package 110; only heat sink 160 is removed. After this occurs, any thermally conductive adhesive or epoxy that was utilized to adhere integrated circuit die 120 to heat sink 160 is removed (using a suitable etch chemistry such as that used to remove the portion of package 110 as described above) to expose a bottom surface 400 of integrated circuit die 120.

Figure 5:
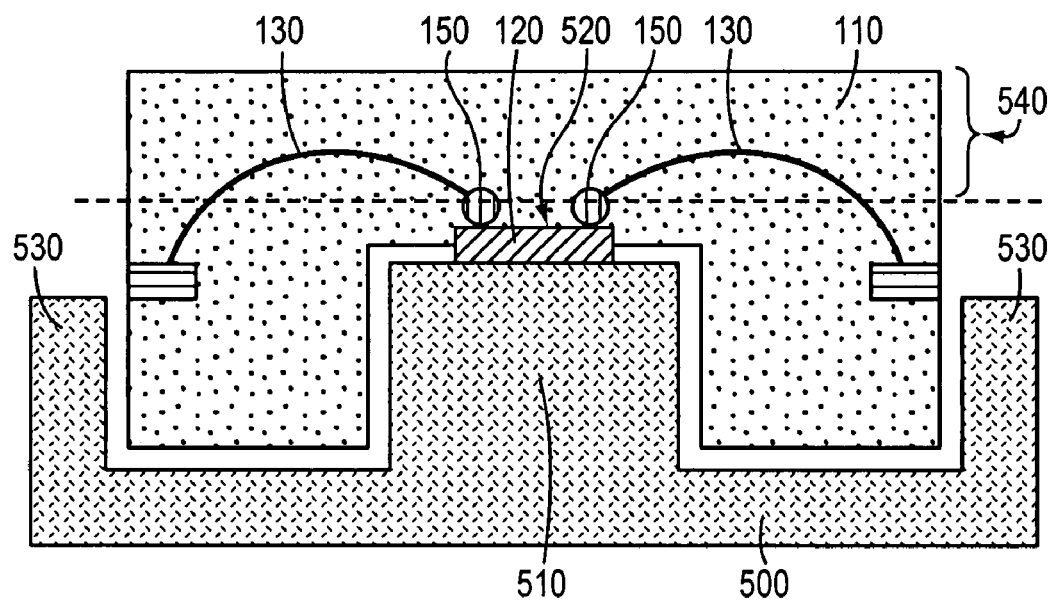

Referring to FIG. 5, packaged integrated circuit die 100 is attached to a lapping fixture 500 by means of an adhesive, e.g., wax. Lapping fixture 500 may include, or consist essentially of a rigid material. In an embodiment, lapping fixture 500 consists essentially of stainless steel. Packaged integrated circuit die 100 is positioned on lapping fixture 500 such that bottom surface 400 is in intimate contact with the center post 510 of fixture 500. Lapping fixture 500 is precision machined (i.e., the top surfaces of center post 510 and the side posts 530 are coplanar to within approximately 2 micrometers) such that, when bottom surface 400 is in intimate contact with center post 510, an arbitrary thickness of package 110 may be removed from above a top surface 520 of integrated circuit die 120.

Figure 6:
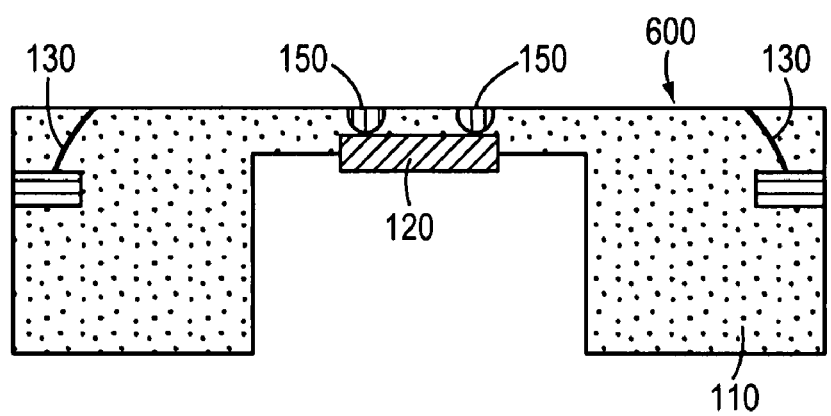

Referring to FIG. 5 and also FIG. 6, a top portion 540 of package 110 is removed by mechanical lapping, for example, by using a Logitech LP50 lapping machine, available from Logitech Ltd., of Glasgow, Scotland. In an embodiment, the lapped top surface 600 of package 110 is approximately parallel to top surface 520 of integrated circuit die 120, and is positioned at a height of approximately 20 micrometers from top surface 520. Portions of wires 130 and/or ball bonds 150 may be exposed after completing the lapping step. Packaged integrated circuit die 100 is then removed from lapping fixture 500. Although the new top surface 600 of package 110 is substantially planar, and hence suitable for further processing, e.g., bonding, the remaining portion of package 110 obscures top surface 520, preventing visual inspection of integrated circuit die 120. Moreover, pieces of package 110 could act as contaminants in further processing steps. Therefore, it is desirable to remove the remainder of package 110 such that top surface 520 is both revealed and substantially planar.

Figure 7:
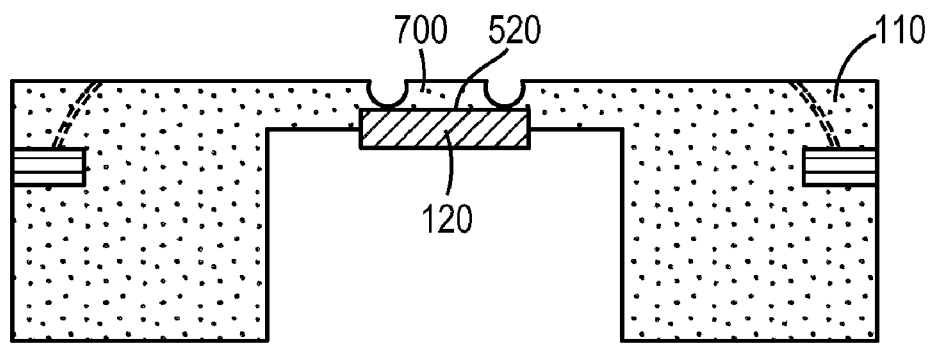
Figure 8:
FIG. 8 is a schematic cross-sectional view of an integrated circuit die removed from its package.

Referring to FIGS. 7 and 8, in order to achieve a substantially planar top surface 520, at least portions of the remaining wires 130 and ball bonds 150 are removed. This can be accomplished, e.g., by etching. In an embodiment, wires 130 and ball bonds 150 consist essentially of gold and are removed using an etchant including a mixture of potassium iodide (KI) and $H_2O$. In an embodiment, iodine ($I_2$) is added to the etch mixture to enhance its etching properties. A portion 700 of package 110 masks top surface 520 during the removal step, preventing damage to the circuitry thereon. In an embodiment, a portion of each ball bond 150 remains over each of the bond pads on top surface 520. Thereafter, the remainder of package 110, including portion 700, is removed from integrated circuit die 120, e.g., by etching. As described above, package 110 may be removed by using a combination of $HNO_3$ and $H_2SO_4$ in a commercial etch tool. After removal of the remaining portions of package 110, integrated circuit die 120 is completely exposed. Due to the prior removal of at least a portion of wires 130 and ball bonds 150, top surface 520 of integrated circuit die 120 is substantially planar, i.e., sufficiently planar to be utilized in subsequent bonding processes to other electronic devices (described below). At this point, the remaining portions of ball bonds 150 may each be less than approximately 75% of an intact ball bond. The planarity of top surface 520 may be further improved by removal of remaining portions of ball bonds 150 by, e.g., mechanical polishing. In an embodiment, top surface 520 is planar to within ±2 micrometers, or even more preferably, to within ±1 micrometer or even ±0.5 micrometers. Top surface 520, now completely exposed, may be visually inspected. Moreover, integrated circuit die 120, removed from its package, still possesses electrical characteristics substantially corresponding to those it exhibited prior to package removal. These electrical characteristics may be verified at this stage by electrical probing of the revealed bond pads and/or any remnants of ball bonds 150.

Referring to FIGS. 9A and 9B, the released integrated circuit die 900 (see FIG. 9B) has a cross-sectional area 910, for example, of top surface 520, that is substantially equal to the cross-sectional area 920 of integrated circuit 120 before package 110 is removed. Thus, the dashed boundary of cross-sectional area 920 indicates the boundaries of integrated circuit die 120 while it is still within package 110 (for example, FIG. 9A could correspond to a top view of packaged integrated circuit 100 as shown in FIG. 2 before package removal). As substantially all of package 110 has been removed from released integrated circuit die 900, it possesses a minimum cross-sectional area.

Referring to FIG. 10, released integrated circuit die 900 can be utilized in the fabrication of multi-chip electronic devices. Released integrated circuit die 900 is optionally thinned by, e.g., mechanically grinding bottom surface 400, and then bonded to a substrate 1000. As illustrated, substrate 1000 includes an electronic device 1010. At least one electrical connection 1020 (e.g., a via) between released integrated circuit die 900 and electronic device 1010 may be formed by, e.g., drilling a hole through substrate 1000 and filling the hole with a conductive material such as aluminum or copper. The finished multi-chip module 1030 may include the functionality of both released integrated circuit die 900 and electronic device 1010. The elimination of package 110 allows the multi-chip module 1030 to have a minimum size. In a similar manner, one or more additional integrated circuit dies or electronic devices may be interconnected to multi-chip module 1030, as desired.

Another advantage of the package-removal approach described herein is the fact that, unlike conventional techniques, it can be applied to multiple packaged integrated circuit dies approximately simultaneously (i.e., the packaged dies can be batch processed) to improve throughput. For example, the steps of removing the backside of package 110 to reveal heat sink 160, the removal of heat sink 160, the lapping of package 110, and the final removal of package 110 can all be performed on multiple packaged dies at once. The released dies will each have a minimum cross-sectional area approximately equal to that of each packaged die, and will each have an exposed, substantially planar top surface suitable for visual inspection and/or bonding processes. Thus, this approach to package removal is superior to conventional techniques in which portions of the package remain attached to the die after precision cuts performed one die at a time. Such conventional techniques not only leave portions of the package obscuring the top surfaces of dies, but also leave package remnants on the perimeters of the dies, thus increasing their cross-sectional areas. Unremoved package portions can also contaminate equipment used for further processing.

The invention may be embodied in other specific forms without departing from the spirit or essential characteristics thereof. The foregoing embodiments are therefore to be considered in all respects illustrative rather than limiting on the invention described herein.

What is claimed is:

1. A method comprising:
   providing a structure comprising:
      a package comprising a plurality of leads;
      an integrated circuit die having a first cross-sectional area disposed within the package; and
      a plurality of wires and ball bonds disposed within the package;
   removing a first portion of the package disposed over a top surface of the integrated circuit die and at least a portion of each of the plurality of wires;
   removing a remaining portion of each of the plurality of wires and at least a portion of each ball bond, wherein a second portion of the package disposed over the top surface of the integrated circuit die protects the top surface during removal;
   etching away the second portion of the package;
   thereafter, bonding the integrated circuit die to a substrate comprising an electronic device; and
   forming an electrical connection between the integrated circuit die and the electronic device, thereby forming a multi-chip module having a minimum size.

2. The method of claim 1, wherein etching away the second portion of the package exposes the top surface of the integrated circuit die.

3. The method of claim 2, wherein the exposed top surface of the integrated circuit die is substantially planar.

4. The method of claim 2, further comprising thinning the integrated circuit die after etching away the second portion and prior to bonding the integrated circuit die to the substrate.

5. The method of claim 1, wherein etching away the second portion of the package comprises removing substantially all of the remaining package.

6. The method of claim 5, wherein a final cross-sectional area of the integrated circuit die after etching away the second portion of the package is substantially equal to the first cross-sectional area.

7. The method of claim 1, further comprising, prior to removing the first portion of the package, removing a third portion of the package disposed under a bottom surface of the integrated circuit die.

8. The method of claim 7, further comprising removing a heat sink disposed under the bottom surface of the integrated circuit die.

9. A method comprising:
   providing a structure comprising:
      a package comprising a plurality of leads;
      an integrated circuit die having a first cross-sectional area disposed within the package; and
      a plurality of wires and ball bonds disposed within the package;
   removing a first portion of the package disposed over a top surface of the integrated circuit die and at least a portion of each of the plurality of wires;

removing a remaining portion of each of the plurality of wires and at least a portion of each ball bond, wherein a second portion of the package disposed over the top surface of the integrated circuit die protects the top surface during removal;

removing the second portion of the package; and removing any remaining portion of each ball bond.

10. The method of claim 1, wherein prior to removing the first portion of the package, the integrated circuit die comprises a first set of electrical characteristics, after removing the second portion of the package, the integrated circuit die comprises a second set of electrical characteristics, the first set of electrical characteristics and the second set of electrical characteristics being substantially equivalent.

11. The method of claim 1, wherein the integrated circuit die is bonded to a first surface of the substrate and the electronic device is disposed on a second surface of the substrate opposite the first surface.

12. The method of claim 1, wherein forming the electrical connection comprises forming a via interconnecting the integrated circuit die and the electronic device.

13. The method of claim 12, wherein forming the via comprises forming a hole through the substrate and filling the hole with a conductive material.

14. The method of claim 1, further comprising interconnecting at least one of an additional integrated circuit die or an additional electronic device to the multi-chip module.

15. The method of claim 1, wherein each ball bond contacts a separate bonding pad on the top surface of the integrated circuit die, the electrical connection being provided to a bonding pad.

* * * * *